United States Patent
Chen et al.

(10) Patent No.: US 7,091,583 B2
(45) Date of Patent: Aug. 15, 2006

(54) METHOD AND STRUCTURE FOR PREVENTION LEAKAGE OF SUBSTRATE STRIP

(75) Inventors: Ying-Chih Chen, Kaohsiung (TW);
Yun-Hsiang Tien, Fengshan (TW);
Ming-Jiun Lai, Changhua County (TW); Yi-Chuan Ding, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 141 days.

(21) Appl. No.: 10/933,349

(22) Filed: Sep. 3, 2004

(65) Prior Publication Data
US 2005/0051881 A1    Mar. 10, 2005

(30) Foreign Application Priority Data
Sep. 4, 2003 (TW) .............................. 92124508 A

(51) Int. Cl.
*H01L 23/02* (2006.01)

(52) U.S. Cl. ............................... 257/678; 257/E21.504; 257/E23.002; 257/E23.069

(58) Field of Classification Search ........ 257/E21.504, 257/E23.002, E23.069, E23.07; 438/114, 438/465
See application file for complete search history.

(56) References Cited

U.S. PATENT DOCUMENTS
6,723,583 B1 *  4/2004  Takahashi et al. .......... 438/114

FOREIGN PATENT DOCUMENTS
TW            508769           10/2002

* cited by examiner

*Primary Examiner*—Mai-Huong Tran
(74) *Attorney, Agent, or Firm*—Troxell Law Office, PLLC

(57) ABSTRACT

The present invention provides a structure and a method for prevention leakage of a substrate strip. The substrate strip includes an edge portion and a plurality of units. A patterned metal layer on a surface of the substrate strip includes at least one plating bus extended to the edge portion, a plurality of plating lines at the units, a plurality of contact pads at the units and a plurality of fiducial marks at the edge portion. The plating bus has an extended trail having one end exposed out of the sidewall of the substrate strip. The fiducial marks and the contact pads are exposed out of a plurality of first openings of a solder mask. The solder mask also has a second opening at the edge portion exposing a portion of the plating bus to define a breaking hole. After forming a surface layer on the fiducial marks and the contact pads, the exposed portion of the plating bus is void of the surface layer. By removing the exposed portion of the plating bus, the breaking hole is formed to electrically isolate the extended trail from the contact pads in order to prevent a chip on the substrate strip from being damaged by ESD (Electrostatic Discharge) during packaging processes.

26 Claims, 9 Drawing Sheets

METHOD AND STRUCTURE FOR PREVENTION LEAKAGE OF SUBSTRATE STRIP

FIELD OF THE INVENTION

The present invention relates to a package substrate strip and, more particularly, to a method and a structure for prevention leakage from plating buses.

BACKGROUND OF THE INVENTION

A conventional substrate strip for semiconductor packages is formed with plating buses and plating lines for plating a metal surface layer on contact pads. Normally the plating buses are extended to the sidewalls of the substrate strip. In the packaging processes, the substrate strip is conveyed by a track. The ESD (Electrostatic Discharge) will occur by the contact between the exposed plating buses at the sidewalls of the package substrate strip and the conveying track, which will damage the electrical functions of chips on the substrate strip. In order to prevent chips on the substrate strip from being damaged by ESD, R.O.C. Taiwan Pat. No. 508,769 discloses a conventional substrate strip with a layer of copper-mesh layer being electrically connected to the molding gate. While ESD is occurred during the molding process, electric charges are conducted to the copper-mesh layer and discharged. This will prevent a chip from being damaged by ESD during molding processes, but ESD still can happen while conveying the substrate strip.

Conventionally, to prevent ESD in a substrate strip is to route a through slot between units to remove plating buses on the scribe lines, and to cut off the plating buses extending to the edge of substrate strip and to create electrically "OPEN" between the substrate strip and the units. Nevertheless, the width of the through hole is larger than that of the scribe lines between the units, therefore, the effective area of the substrate strip for the units will be greatly reduced and the packaging cost will be increased, moreover, the package substrate strip is easily deformed.

Another conventional way to prevent ESD during conveying a substrate is revealed in R.O.C. Taiwan Pat. No. 479,344. At least a plating bus out of units and a plurality of branched plating lines inside the units are formed on a substrate. A plurality of bridging lines interconnect the solder-ball pads inside the units for plating. After electroplating, a plurality of holes are drilled in the bridging lines. The drilled holes are formed at the units and corresponding to each bridging lines in order to electrically isolate the solder-ball pads. Thereafter, an insulation material is filled in each drilled hole and even to the surface of the substrate. Nevertheless, the drilling holes are formed at the units, they may affect the package structure and reliability of the package substrates. To avoid this, they have to be filled with an insulation material, and this would increase packaging procedure and cost. Furthermore, the plating buses have to be redesigned to match up with the drilled holes.

SUMMARY OF THE INVENTION

A main purpose of the present invention is to supply a method for manufacturing a substrate strip. The substrate strip includes at least one plating bus at the edge portion and a plurality of plating lines at the units. The plating bus has an extended trail extended to the sidewall of the substrate strip. After formation of a solder mask on the substrate strip and formation of a surface layer on the contact pads, a breaking hole is formed at the edge portion so that the extended trail is electrically isolated from the contact pads in order to prevent a chip on the substrate strip from being damaged by ESD while conveying during packaging processes, and to increase packaging yield without extra hole-drilling processes in units.

According to the present invention, a substrate strip is provided comprising an edge portion and a plurality of units. The substrate strip has a surface and a sidewall. A patterned metal layer is formed on the surface of the substrate strip. The patterned metal layer includes at least one plating bus extended to the edge portion, a plurality of plating lines at the units, a plurality of contact pads at the units and a plurality of fiducial marks at the edge portion. The contact pads are electrically connected to the plating bus via the plating lines. The plating bus has an extended trail having one end exposed out of the sidewall of the substrate strip. A solder mask is formed on the surface of the substrate strip. The solder mask has a plurality of first openings exposing the contact pads and the fiducial marks, and at least a second opening at the edge portion exposing a predetermined portion of the plating bus, if necessary. Thereafter, a surface layer is formed on the contact pads and the fiducial marks. After removing the exposed portion of the plating bus by etching, mechanical drilling or laser drilling, a breaking hole is formed to electrically isolate the extended trail of the plating bus from the contact pads. Leakage between a chip on the substrate strip and the plating bus is avoided, the chip cannot be damaged by ESD during packaging process in a simple formation of the breaking hole.

DETAIL DESCRIPTION OF THE INVENTION

Please refer to the drawings attached, present invention will be described by means of the embodiments below.

Figure 1A:
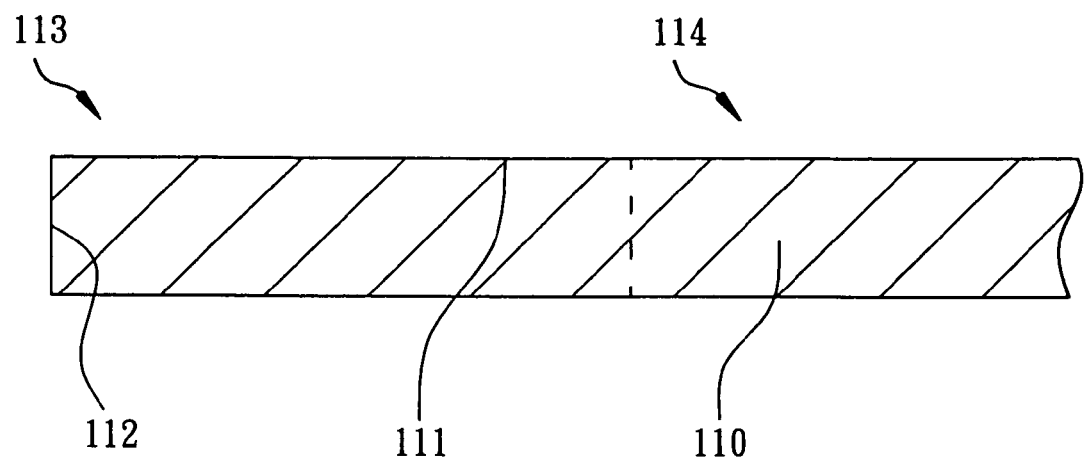
FIG. 1A to 1G are cross-sectional views of a substrate strip for semiconductor packages during a manufacturing process in accordance with the first embodiment of the present invention.
Figure 2:
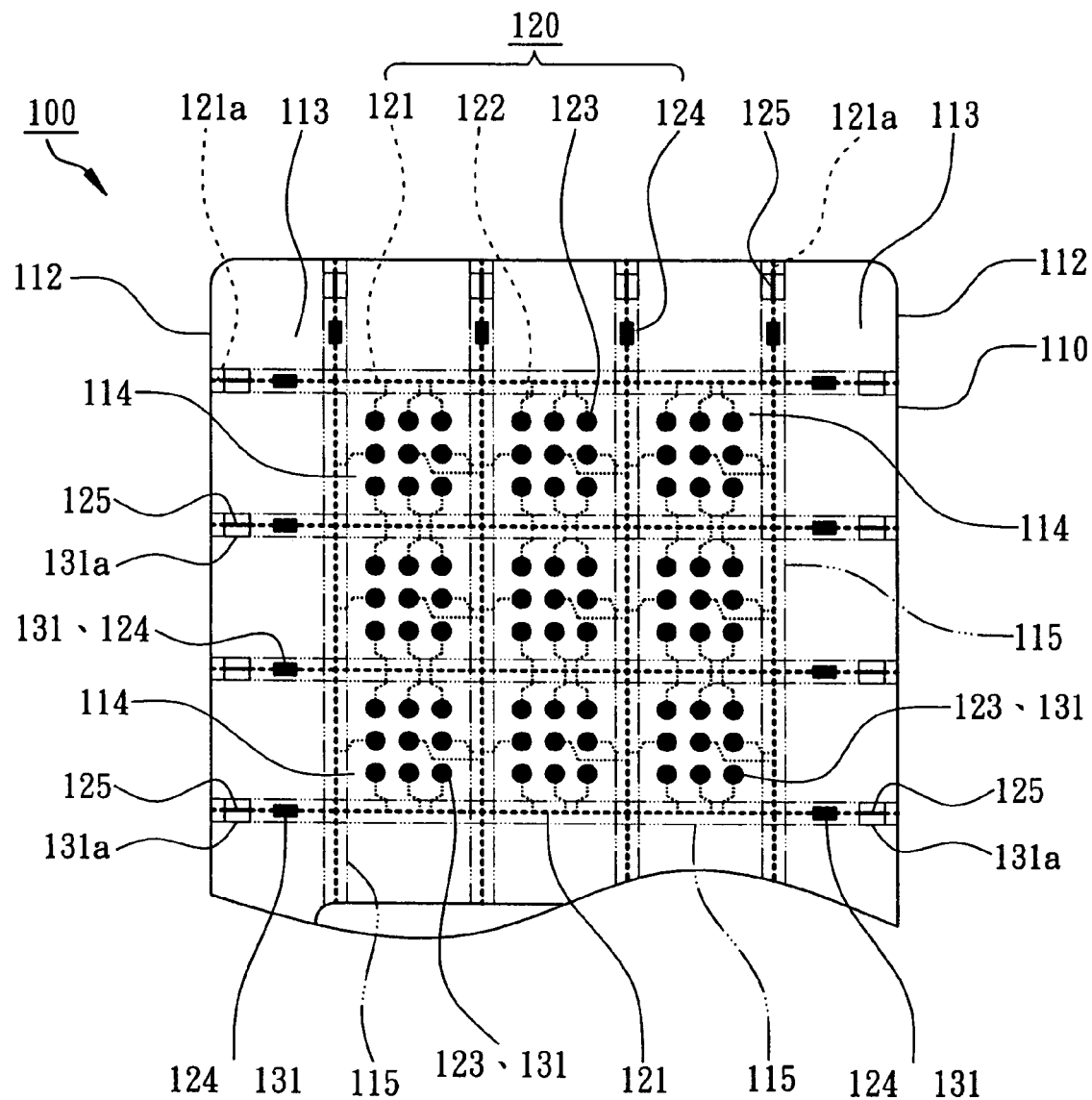
FIG. 2 is a top view of the substrate strip before forming breaking holes in accordance with the first embodiment of present invention.

According to the first embodiment of the present invention, a method for manufacturing a substrate strip body 110 is disclosed. As shown in FIGS. 1A and 2, a substrate strip 110 is provided. The substrate strip 110 has a surface 111 and at least one sidewall 112, and the substrate strip 110 also includes at least one edge portion 113 and a plurality of units 114. The units 114 are arranged in at least one matrix and are surrounded by the edge portion 113. Referring to FIG. 2, a plurality of scribe lines 115 are formed between the units 114 and extending to the edge portion 113.

Figure 1B:
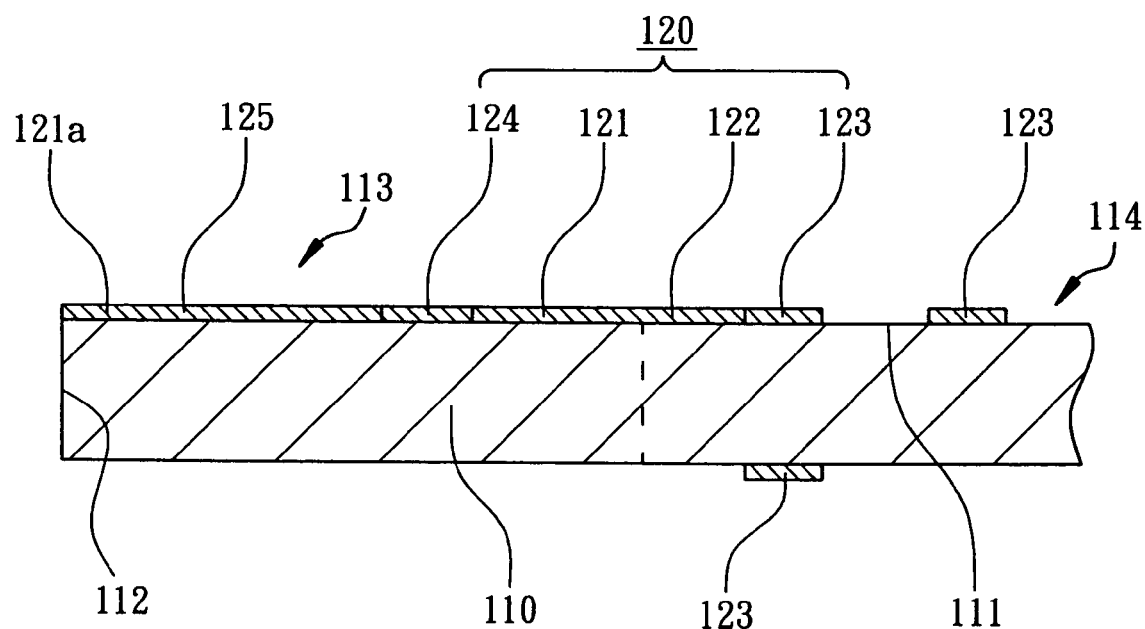

As shown in FIGS. 1B and 2, a patterned metal layer 120 is formed on the surface 111 of the substrate strip 110. One of the methods to form the patterned metal layer 120 is to laminate a Cu foil on the surface 111 of substrate strip 110, and then patterned the Cu foil by exposure, development, and etching. The patterned metal layer 120 includes at least one plating bus 121 extended to the edge portion 113, a plurality of plating lines 122 at the units 114, a plurality of contact pads 123 at the units 114, a plurality of fiducial marks 124 at the edge portion 113 and a plurality of conductive traces at the units 114. The contact pads 123 are electrically connected to the plating bus 121 via the plurality of plating lines 122. In this embodiment, a plurality of scribe lines 115 are defined between the units 114, and there are a plurality of plating buses 121 corresponding to the scribe lines 115. Each plating bus 121 has at least one extended trails 121a having one end exposed out of the sidewall 112. A pre-cut point 125 for locating a breaking hole is defined on a portion of the plating bus 121 at one of the edge, portions 113 adjacent to the sidewall 112. The extended trails 121a is extended from the pre-cut point 125 to the sidewall 112. That is, the pre-cut point 125 is located between the sidewall 112 and the contact pads 123. It is preferable to dispose another contact pads 123 on the other surface of the substrate strip 110.

Figure 1C:
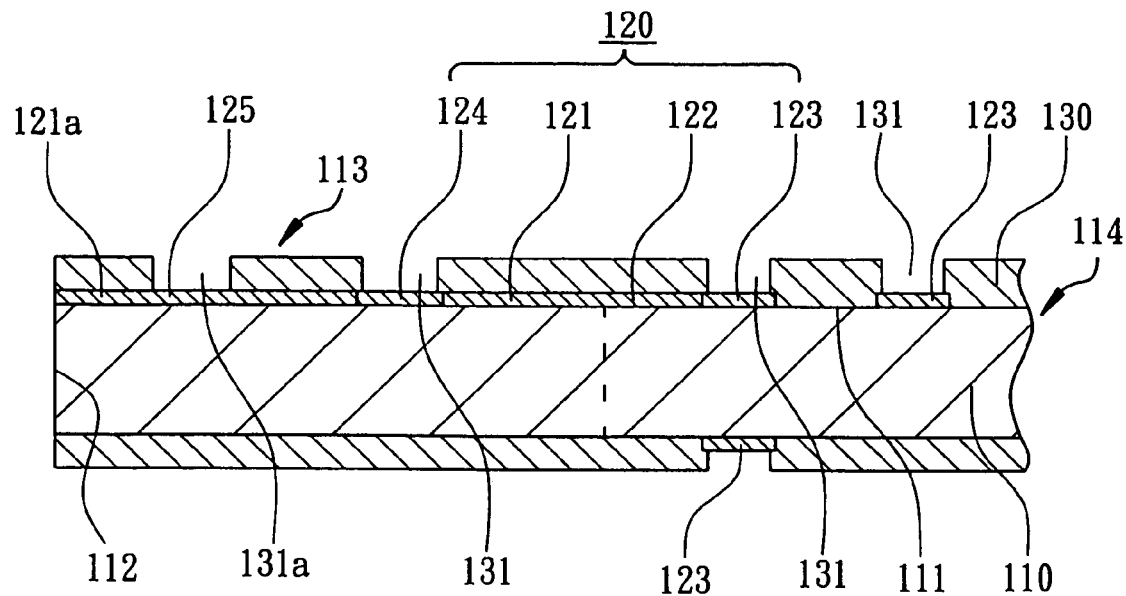

As shown in FIGS. 1C and 2, a solder mask 130 is formed on the surface 111 of substrate strip 110 to cover the patterned metal layer 120. The solder mask 130 has a plurality of first openings 131 and at least a second opening 131a. The first openings 131 are formed to expose the contact pads 123 and fiducial marks 124. The second opening 131a is formed to expose the pre-cut point 125 which is a portion of the plating bus 121 at the edge portion 113, and to define the breaking hole.

Figure 1D:
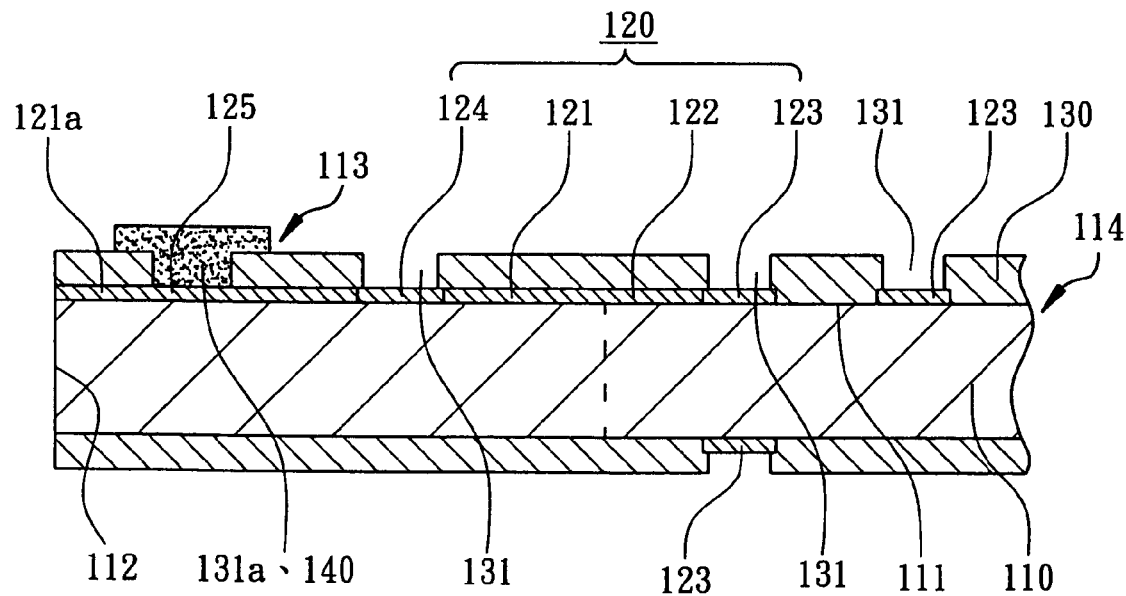
Figure 1E:
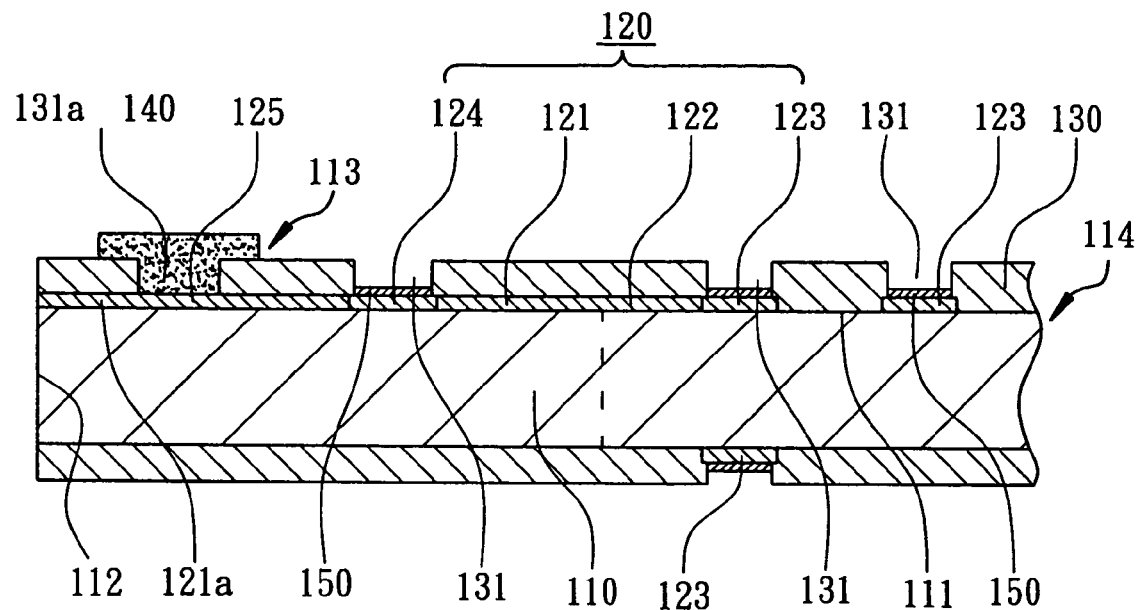
Figure 1F:
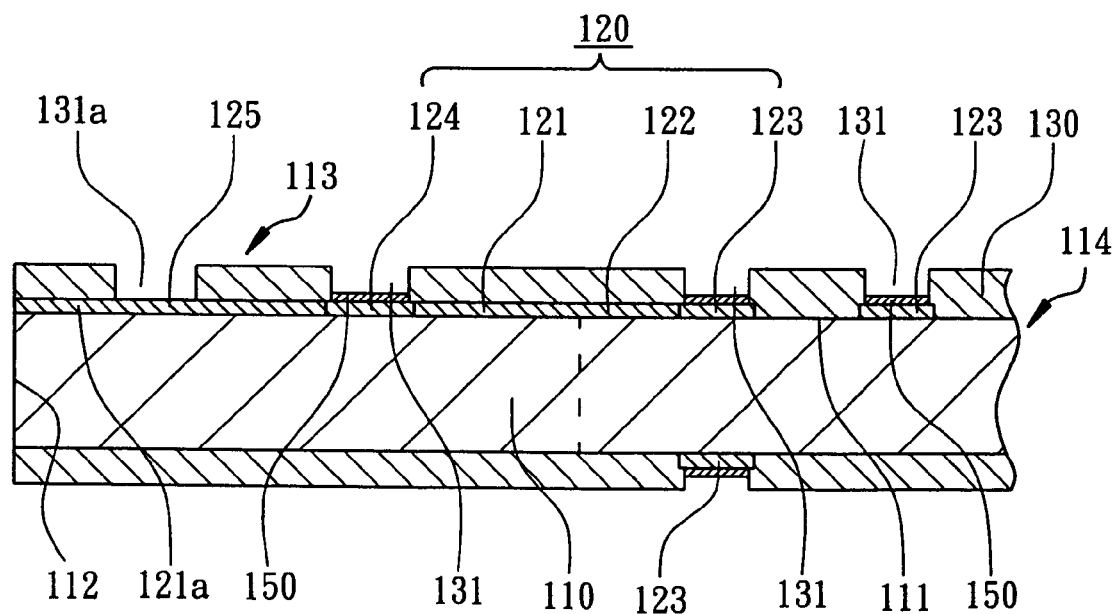

Next a selective plating step to forming a surface layer 150 is executed. As shown in FIG. 1D, a layer of photoresist 140 is formed on the solder mask 130 on the surface 111 of substrate strip 110. The photoresist 140 is patterned by exposure and development so as to cover the pre-cut point 125 and expose the fiducial marks 124 and the contact pads 123. It is preferable that the patterned metal layer 120 is electroplated through the plating bus 121 to form a surface layer 150 on the contact pads 123 and the fiducial marks 124. The surface layer 150 can be made of nickel, nickel/gold or pre-solder material. Therefore the pre-cut point 125 is void of the surface layer 150. As shown in FIG. 1F, the pre-cut point 125 is exposed out of the second opening 131a by removing the photoresist 140.

Figure 1G:
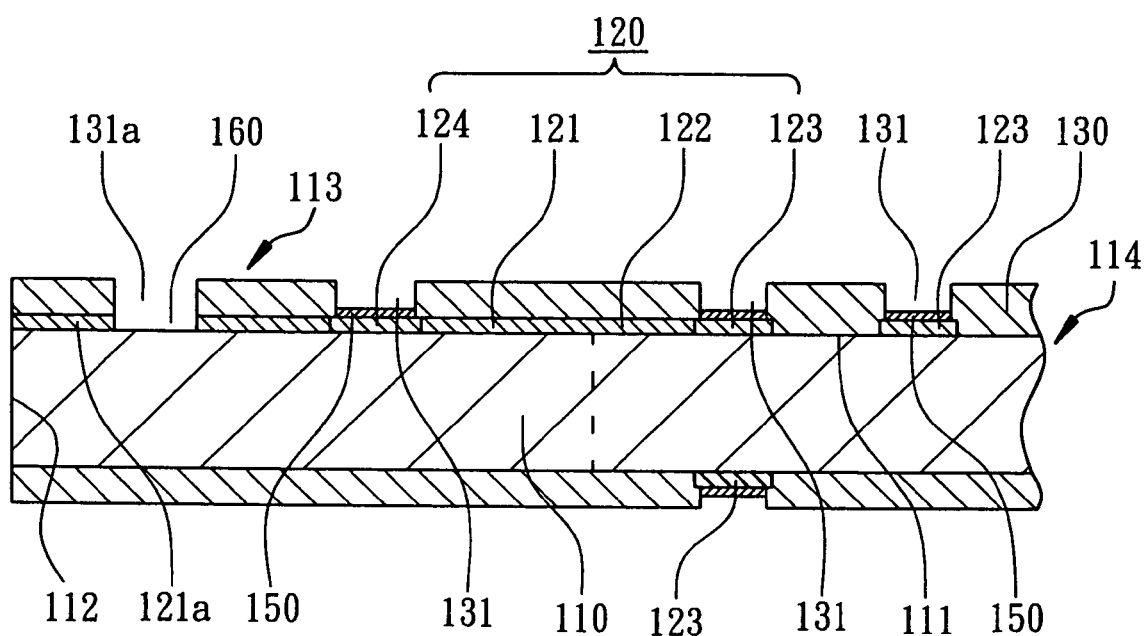
Figure 3:
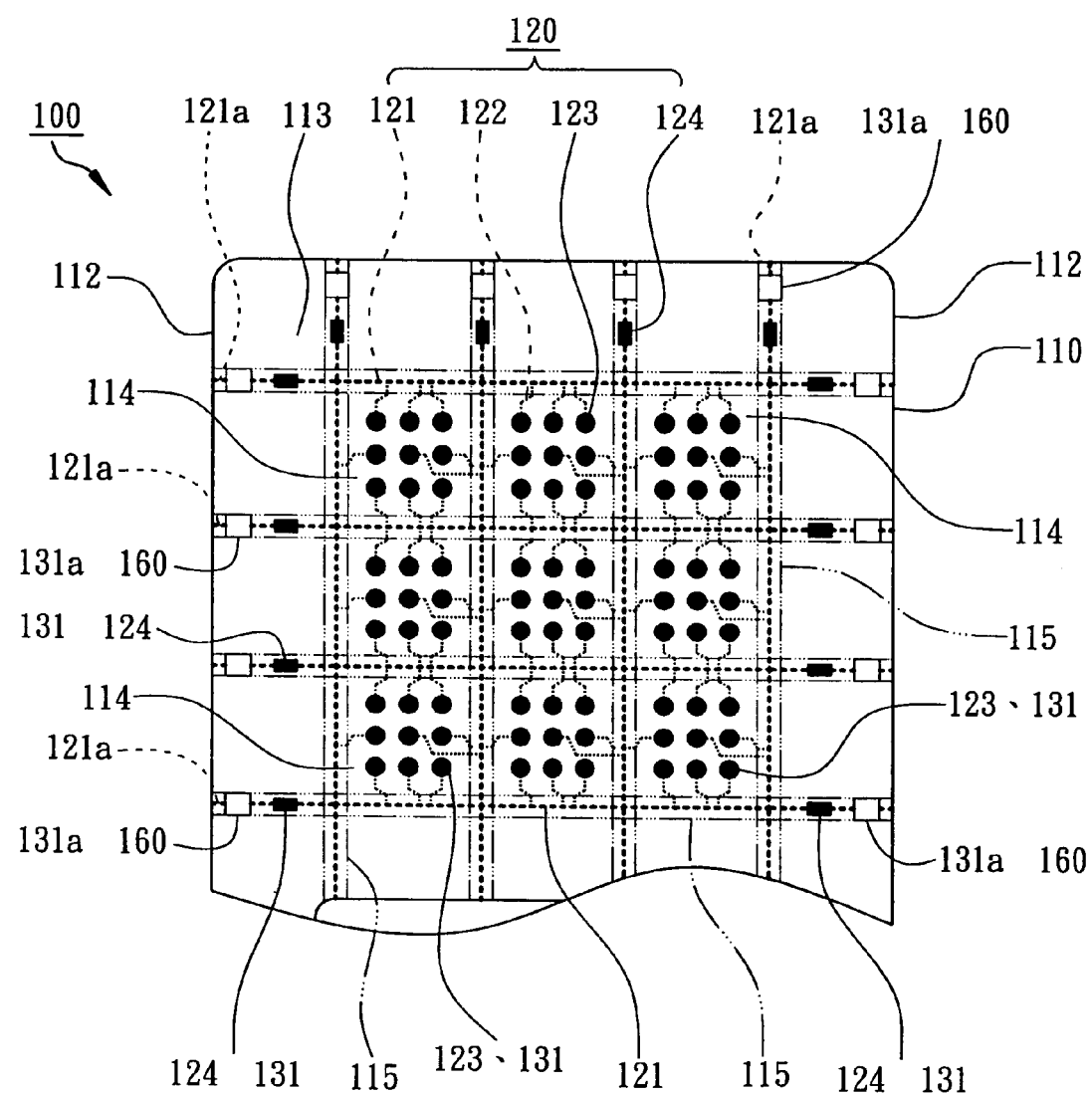
FIG. 3 is a top view of the package substrate strip in accordance with the first embodiment of the present invention.

Then, an etching step is performed. As shown in FIGS. 1G and 3, the pre-cut point 125 can be etched through the second opening 131a of the exposed pre-cut point 125 so as to form a breaking hole 160. The diameter of the breaking hole 160 is larger than the width of the plating buses 121 and is less than 3.0 mm. In this embodiment, the breaking hole 160 is a square hole of 0.25 mm by 0.25 mm. The breaking hole 160 electrically isolates the extended trail 121a of the plating bus 121 at the edge portion 113 from the contact pads 123, also electrically isolates the extended trail 121a from the plating lines 122. There is no leakage between the contact pads 123 and the extended trail 121a of the plating bus 121 to prevent a chip from being damaged by ESD causing by contacting with the conveying tracks of the packaging equipment during a packaging process.

The characteristics of the manufacturing method described above is to form a breaking hole 160 that is located at the edge portion 113 adjacent to the sidewall 112 and electrically isolating the extended trail 121a of the plating bus 121 from the contact pads 123 and the plating lines 122. This would prevent a chip from being damaged by ESD occurring by the contact between the package substrate strip 110 and the conveying tracks of the packaging equipment. Furthermore, the breaking hole 160 at the edge portion 113 is away from the units 114 of the substrate strip 110. After packaging and singulation, the edge portion 113 including the breaking hole 160 is removed. Therefore, it is not necessary to redesign the pattern of plating buses and would not affect original package structure and reliability.

As shown in FIGS. 1G and 3, a substrate strip is manufactured from the above-described method. The substrate strip 110 includes a plurality of units 114 in matrix, an edge portion 113 around the units 114, and a plurality of scribe lines 115 formed between the units 114. The substrate strip 110 also has a surface 111 and a plurality of sidewalls 112. Formed above the substrate strip 110 are a patterned metal layer 120, a solder mask 130 and a surface layer 150. The patterned metal layer 120 is formed on the surface 111 of the substrate strip 110. The patterned metal layer 120 includes the plating bus 121 along the scribe lines 115 extended to the edge portion 113, a plurality of plating lines 122 at the units 114, a plurality of contact pads 123 at the units 114 and a plurality of fiducial marks 124 at the edge portion 113. The contact pads 123 are electrically connected to plating bus 121 via the plating lines 122. The plating bus 121 has an extended trail 121a having an end exposed out of one of the sidewalls 112. The extended trail 121a of the plating bus 121 is electrically isolated from the contact pads 123 via the breaking hole 160. In this embodiment, the breaking hole 160 at the edge portion 113 is defined by the second opening 131a of the solder mask 130. The diameter of the breaking hole 160 is larger than the width of the plating bus 121. Preferably, the fiducial marks 124 are formed in the extended trail 121a for checking electrical breaking effect of the breaking hole 160 (not shown in the figures). The fiducial marks 124 may be positioned on the scribe lines 115. The solder mask 130 is formed on the surface 111 of substrate strip 110. The solder mask 130 has a plurality of first openings 131 and at least a second opening 131a. The first openings 131 expose the contact pads 123 and the fiducial marks 124. The second opening 131a exposes a predetermined portion of the plating bus 121 at the edge portion 113 to define the breaking hole 160. Referring to FIG. 1G, the breaking hole 160 is void of the surface layer 150 after etching to electrically isolate the extended trail 121a of the plating buses 121 from the contact pads 123. The surface layer 150 is formed on the contact pads 123 and the fiducial marks 124 of the patterned metal layer 120. A chip on the substrate strip 110 is prevented from being damaged by ESD causing by friction during packaging.

Figure 4A:
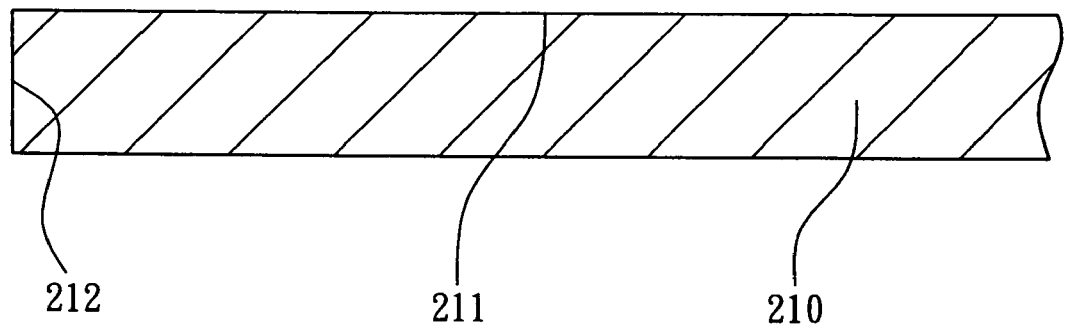
FIG. 4A to 4E are cross-sectional views of a substrate strip for semiconductor packages during a manufacturing process in accordance with the second embodiment of the present invention.
Figure 4B:
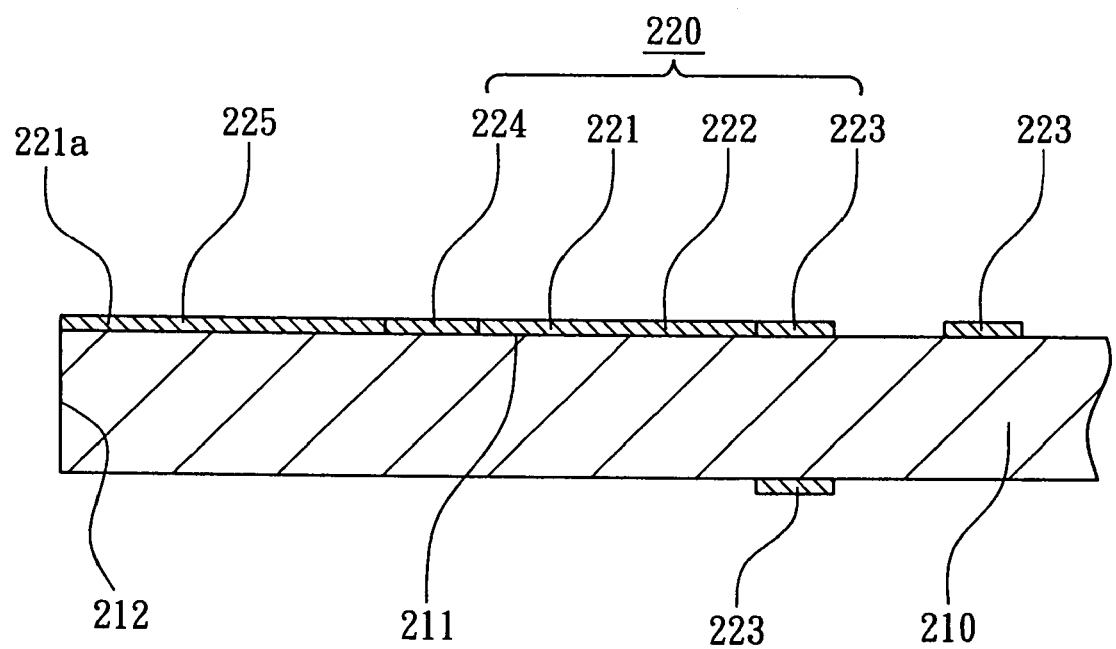
Figure 4C:
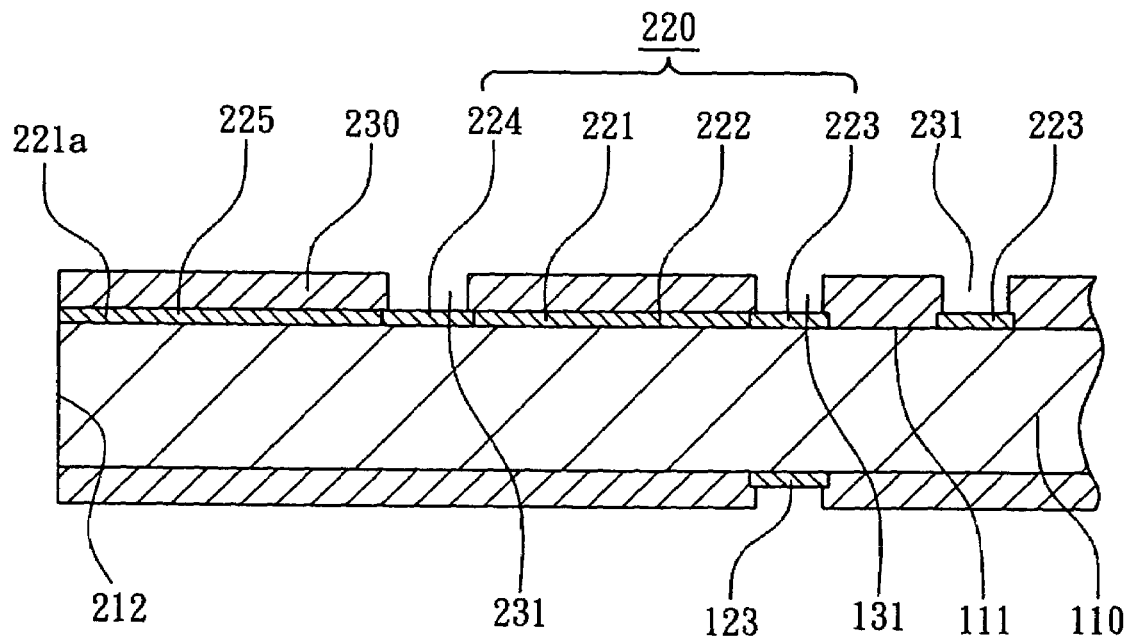
Figure 4D:
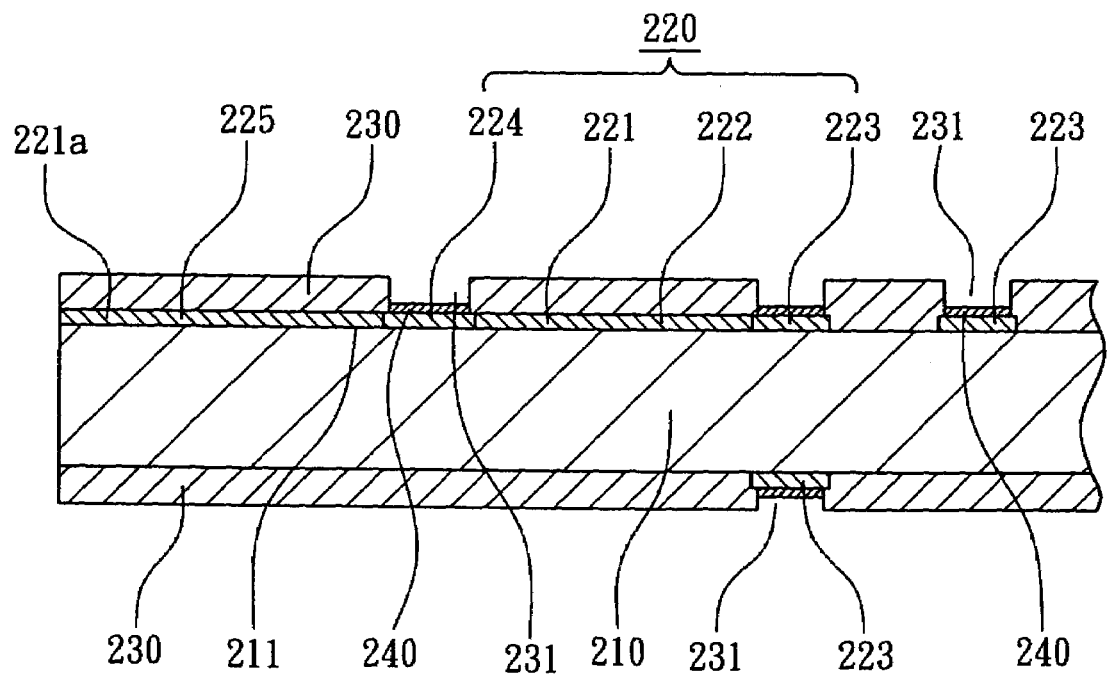
Figure 4E:
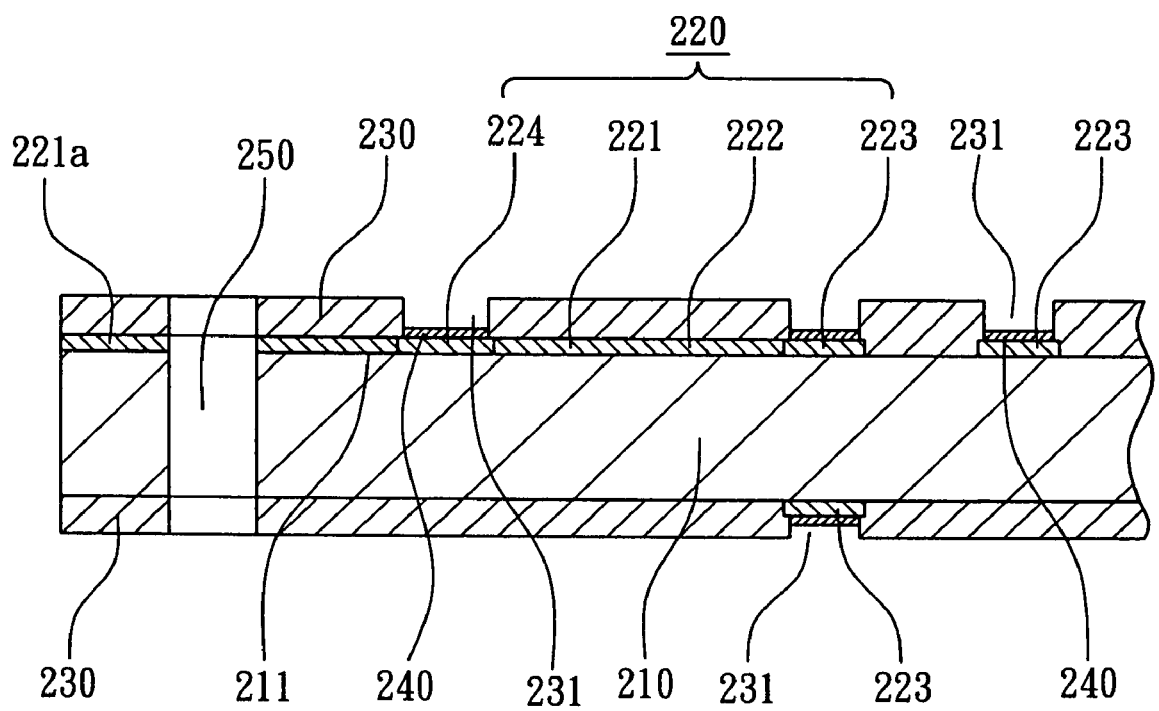

According to the second embodiment of the present invention, a method for manufacturing a package substrate strip is illustrated from FIG. 4A to 4E. Firstly as shown in FIG. 4A, a substrate strip 210 is provided. The substrate strip 210 has a surface 211 and a plurality of sidewalls 212. As shown in FIG. 4B, a patterned metal layer 220 is formed on the surface 211 of the substrate strip 210. The patterned metal layer 220 includes at least one plating bus 221 extended to an edge portion of the substrate strip 210, a plurality of plating lines 222 in units of the substrate strip 210, a plurality of contact pads 223 in units of the substrate strip 210, a plurality of fiducial marks 224 at the edge portion of the substrate strip 210. The plating bus 221 defines at least a pre-cut point 225 and is electrically connected to the contact pads 223 via the plating lines 222. The plating bus 221 has an extended trails 221a having one end exposed out of one of the sidewalls 212. The fiducial marks 224 are also formed on the plating bus 221, that is, the fiducial marks 224 and the pre-cut point 225 are located away from the units of the substrate strip 210. Then, as shown in FIG. 4C, a solder mask 230 is formed on the surface 211 of the substrate strip 210. The solder mask 230 has a plurality of openings 231 exposing the contact pads 223 and fiducial marks 224. As shown in FIG. 4D, the contact pads 223 of the patterned metal layer 220 is electroplated with a surface layer 240 via the plating bus 221. The material of the surface layer 240 is nickel or nickel/gold. Please refer to FIG. 4E, at least a breaking hole 250 is formed at the pre-cut point 225 by mechanical drilling or laser drilling. The breaking hole 250 passes through the substrate strip 210. Also the diameter of the opening 250 is larger than the width of the plating buses 221 and less than 3.0 mm. In this embodiment, the opening 250 is a round hole with diameter of 2 mm, to electrically isolate the extended trail 221a of the plating bus 221 from the contact pads 223. This can prevent a chip on the substrate strip 210 from being damaged by ESD causing by the contact between the substrate strip 210 and conveying tracks of packaging equipment during packaging processes.

The above description of embodiments of this invention is intended to be illustrative and not limiting. Other embodiments of this invention will be obvious to those skilled in the art in view of the above disclosure.

What is claimed is:

1. A method for manufacturing a substrate strip for semiconductor packages comprising:
    providing a substrate strip including an edge portion and a plurality of units the substrate strip having a surface;
    forming a patterned metal layer on the surface of the substrate strip, the patterned metal layer including at least one plating bus extended to the edge portion, a plurality of plating lines at the units, a plurality of contact pads at the units, and a plurality of fiducial marks at the edge portion, wherein the contact pads are electrically connected to the plating bus via the plating lines, the plating bus has an extended trail having one exposed end;
    forming a solder mask on the surface of the substrate strip, the solder mask having a plurality of first openings exposing the contact pads and the fiducial marks;
    forming a surface layer on the contact pads and the fiducial marks; and
    forming a breaking hole at the edge portion to electrically isolate the extended trail from the contact pads.

2. The method according to claim 1, wherein the fiducial marks are formed on the plating bus.

3. The method according to claim 1, wherein the solder mask has a second opening to expose a portion of the plating bus to define the breaking hole.

4. The method according to claim 3, wherein the exposed portion of the plating bus is void of the surface layer and is removed by etching.

5. The method according to claim 4, further comprising: forming a photoresist on surface of the substrate strip prior to forming the surface layer, the photoresist covering the second opening and exposing the first openings.

6. The method according to claim 3, wherein the diameter of the second opening is larger than the width of the plating buses.

7. The method according to claim 3, wherein the diameter of the second opening is less than 3.0 mm.

8. The method according to claim 3, wherein the second opening is circular.

9. The method according to claim 1, wherein the breaking hole is formed by mechanical drilling.

10. The method according to claim 1, wherein the breaking hole is formed by laser drilling.

11. The method according to claim 1, wherein the substrate strip includes a plurality of scribe lines formed between the units, some of the scribe lines are extended to the edge portion, the fiducial marks and the breaking hole are located on the extended scribe lines at the edge portion.

12. The method according to claim 1, wherein the surface layer is made of nickel/gold.

13. The method according to claim 1, wherein the breaking hole electrically isolates the extended trail from the plating lines.

14. The method according to claim 1, wherein the breaking hole is adjacent to the sidewall of the substrate strip.

15. A substrate strip for semiconductor packages, the substrate strip including an edge portion and a plurality of units and having a surface, comprising:
    a patterned metal layer formed on the surface of substrate strip, the patterned metal layer including at least one plating bus extended to the edge portion, a plurality of plating lines at the units, a plurality of contact pads at the units and a plurality of fiducial marks at the edge portion, wherein the contact pads are electrically connected to the plating bus via the plating lines, the plating bus has an extended trail having one exposed end;
    a solder mask formed on the surface of substrate strip, the solder mask having a plurality of first openings exposing the contact pads and the fiducial marks;
    a surface layer formed on the contact pads and the fiducial marks; and
    a breaking hole formed at the edge portion to electrically isolate the extended trail from the contact pads.

16. The substrate strip according to claim 15, wherein the plurality of fiducial marks are formed on the plating bus.

17. The substrate strip according to claim 15, wherein the breaking hole is void of the surface layer.

18. The substrate strip according to claim 15, wherein the breaking hole passes through the substrate strip.

19. The substrate strip according to claim 15, wherein the diameter of the breaking hole is larger than the width of the plating buses.

20. The substrate strip according to claim 15, wherein the breaking hole is round.

21. The substrate strip according to claim 15, wherein the substrate strip includes a plurality of scribe lines formed between the units, some of the scribe lines are extended to the edge portion, the fiducial marks and the breaking hole are located on the scribe lines at the edge portion.

22. The substrate strip according to claim 15, wherein the breaking hole electrically isolate the fiducial marks from the contact pads.

23. The substrate strip according to claim 15, wherein the surface layer is made of nickel/gold.

24. The substrate strip according to claim 15, wherein the solder mask has a second opening for defining the breaking hole.

25. The substrate strip according to claim 15, wherein the breaking hole electrically isolates the extended trail from the plating lines.

26. The substrate strip according to claim 1, wherein the breaking hole is adjacent to the sidewall of the substrate strip.

* * * * *